(12) United States Patent
Rascuna' et al.

(10) Patent No.: US 11,495,508 B2
(45) Date of Patent: Nov. 8, 2022

(54) SILICON CARBIDE POWER DEVICE WITH IMPROVED ROBUSTNESS AND CORRESPONDING MANUFACTURING PROCESS

(71) Applicant: STMicroelectronics S.r.l., Agrate Brianza (IT)

(72) Inventors: Simone Rascuna', Catania (IT); Claudio Chibbaro, Catania (IT); Alfio Guarnera, Trecastagni (IT); Mario Giuseppe Saggio, Aci Bonaccorsi (IT); Francesco Lizio, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 121 days.

(21) Appl. No.: 17/039,289

(22) Filed: Sep. 30, 2020

(65) Prior Publication Data

US 2021/0104445 A1     Apr. 8, 2021

(30) Foreign Application Priority Data

Oct. 2, 2019    (IT) .......................... 102019000017723

(51) Int. Cl.
*H01L 23/31* (2006.01)
*H01L 21/04* (2006.01)
(Continued)

(52) U.S. Cl.
CPC ........ *H01L 23/3171* (2013.01); *H01L 21/045* (2013.01); *H01L 21/56* (2013.01); *H01L 29/1608* (2013.01)

(58) Field of Classification Search
CPC ... H01L 23/3171; H01L 21/045; H01L 21/56; H01L 29/1608; H01L 23/3192; H01L 29/0615
See application file for complete search history.

(56) References Cited

U.S. PATENT DOCUMENTS 6,656,758 B1    12/2003  Shinogi et al.
2010/0207281 A1  8/2010  Su et al.
(Continued)

FOREIGN PATENT DOCUMENTS

EP        3 144 975 A1    3/2017

OTHER PUBLICATIONS

Murase, Katsumi hereinafter Murase (Japanese Journal of Applied Physics, vol. 33, Issue 3A, pp. 1385 (1994); publication date Mar. 1994) (Year: 1994).*

*Primary Examiner* — Herve-Louis Y Assouman
(74) *Attorney, Agent, or Firm* — Seed IP Law Group LLP (57) ABSTRACT

An electronic power device includes a substrate of silicon carbide (SiC) having a front surface and a rear surface which lie in a horizontal plane and are opposite to one another along a vertical axis. The substrate includes an active area, provided in which are a number of doped regions, and an edge area, which is not active, distinct from and surrounding the active area. A dielectric region is arranged above the front surface, in at least the edge area. A passivation layer is arranged above the front surface of the substrate, and is in contact with the dielectric region in the edge area. The passivation layer includes at least one anchorage region that extends through the thickness of the dielectric region at the edge area, such as to define a mechanical anchorage for the passivation layer.

18 Claims, 11 Drawing Sheets

(51) Int. Cl.
*H01L 21/56* (2006.01)
*H01L 29/16* (2006.01)
*H01L 29/06* (2006.01)
*H01L 29/66* (2006.01)

(56) References Cited

U.S. PATENT DOCUMENTS

2015/0041828 A1   2/2015   Nagao
2017/0110545 A1*  4/2017   Nagao ................. H01L 29/0619

* cited by examiner

SILICON CARBIDE POWER DEVICE WITH IMPROVED ROBUSTNESS AND CORRESPONDING MANUFACTURING PROCESS

BACKGROUND

Technical Field

The present disclosure relates to a silicon carbide (SiC) power device having an improved robustness, in particular in regard to thermomechanical stresses due to thermal cycles; the present disclosure moreover relates to a process for manufacturing the power device.

Description of the Related Art

Integrated electronic devices are known, for example diodes or MOSFETs (Metal-Oxide Semiconductor Field-Effect Transistors) for power-electronic applications, made starting from a silicon carbide substrate.

Such devices are advantageous thanks, at least in part, to the favorable chemico-physical properties of silicon carbide. For instance, silicon carbide generally has a bandgap wider than that of silicon, that is the material commonly used in electronic power devices. Consequently, even with relatively small thicknesses, silicon carbide has a breakdown voltage higher than silicon and can therefore be advantageously used in high-voltage, high-power, and high-temperature applications.

Manufacturing of advanced silicon carbide power devices is, however, affected by some problems due to the dielectric properties of passivation layers used with insulating functions.

On account of the high operating temperature and dielectric rigidity, a polyimide layer (i.e., a polymer of imide monomers) is typically used as passivation and insulation material in current silicon carbide power devices, being for example formed via deposition using spin-coating techniques. Problems of adhesion of this passivation layer to the underlying silicon carbide substrate (or to some other layer of material), in particular after thermal cycles (both during operations of electrical testing and during the effective operating life) currently limit reliability of such power devices.

In particular, due to possible delamination of the passivation layer, caused by thermomechanical stresses after the aforesaid thermal cycles, so-called electrical arching phenomena may occur in reverse biasing, between metal-material regions of the power device, with consequent damage or breakdown of the same power device.

BRIEF SUMMARY

In various embodiments, the present disclosure provides an improved solution for a silicon carbide power device, allowing to overcome the disadvantages highlighted previously associated to known solutions and in particular providing a higher robustness in regard to thermomechanical stresses due to thermal cycles.

According to the present disclosure, a silicon carbide power device and a corresponding manufacturing process are therefore provided.

In one or more embodiments, an electronic power device is provided that includes a substrate of silicon carbide (SiC) having a front surface and a rear surface which lie in a horizontal plane and are opposite to one another along a vertical axis transverse to the horizontal plane. The substrate includes an active area, and a non-active edge area surrounding the active area, and a plurality of doped regions extending from the front surface into the substrate in the active area. A dielectric region is disposed over the front surface in at least the edge area. A passivation layer is disposed over the front surface of the substrate, and the passivation layer is in contact with the dielectric region in the edge area. The passivation layer includes at least one anchorage region that extends through a thickness of the dielectric region at the edge area and is configured to define a mechanical anchorage for the passivation layer.

In one or more embodiments, a process for manufacturing an electronic power device is provided that includes: forming a dielectric region on a front surface of a substrate of silicon carbide (SiC), at an edge area of the substrate, the substrate having the front surface and a rear surface which lie in a horizontal plane and are opposite to one another along a vertical axis transverse to said horizontal plane, said substrate including an active area and the edge area, which is not active, a plurality of doped regions extending from the front surface into the substrate in the active area; and forming a passivation layer over the front surface of said substrate, and in contact with said dielectric region in said edge area. The forming the passivation layer includes forming an anchorage region that extends through a thickness of said dielectric region at said edge area and is configured to define a mechanical anchorage for said passivation layer.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1A:
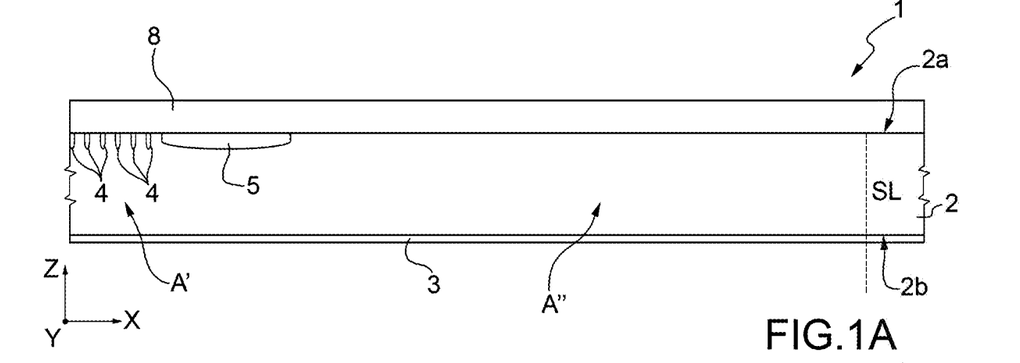
FIGS. 1A-1H are cross-sectional views of a silicon carbide power device, in successive steps of a manufacturing process according to a first embodiment of the present disclosure.

With initial reference to FIG. 1A, a first embodiment of a process for manufacturing a silicon carbide power device is now disclosed.

The above manufacturing process envisages providing a wafer 1 comprising a silicon carbide substrate 2, having a front surface 2a and a rear surface 2b, which extend in a horizontal plane xy and are separate from and opposite to one another along a vertical axis z, transverse to the horizontal plane xy.

In the embodiment illustrated, where the power device is, by way of example, a power diode, a rear cathode contact is formed on the rear surface 2b of the substrate, constituted by a layer of conductive material 3, for example metal material.

Moreover, a plurality of anode wells 4, constituted by appropriately doped regions, are formed at the front surface 2a of the substrate 2, in an active area A' of the power device. In a known manner, each of the aforesaid anode wells 4, which can have a strip-like conformation (in top view, in the horizontal plane xy), represents a cell of the power device.

At the front surface 2a of the substrate 2, in an edge area A" of the power device (distinct and separate from the active area A'), an edge anode region 5 is moreover formed, which is also constituted by an appropriately doped region, having a side extension greater than that of the aforesaid anode wells 4 (in FIG. 1A, along a first axis x of the aforesaid horizontal plane xy).

In a known manner, the edge area A" terminates at a scribe line SL, represented by a dashed line, along which dicing of the wafer 1 will be carried out, for the formation of dies of the power device, once the manufacturing process is completed.

The edge anode region 5 is arranged externally with respect to the active area A' and to the anode wells 4, for example being shaped like a ring around the active area A'. In a way not shown, the aforesaid edge anode region 5 may be connected to a ring-shaped implanted region, which is also formed at the front surface 2a of the substrate 2, at the edge area A" (having, in a known manner, functions of termination of the electrical field).

As shown in the aforesaid FIG. 1A, a thick dielectric layer 8, in particular of TEOS (TetraEthyl OrthoSilicate), is formed by deposition on the substrate 2, coating the entire front surface 2a of the substrate 2; the thick dielectric layer 8 has a thickness comprised, for example, between 0.5 μm and 2.5 μm.

Figure 1B:
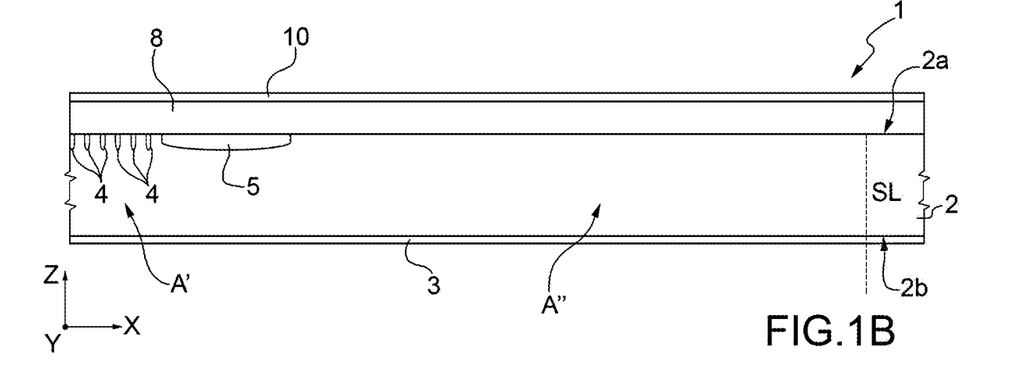

As illustrated in FIG. 1B, an overlying layer 10 is formed by deposition on the thick dielectric layer 8, for example made of polysilicon or of a different material (for example, silicon nitride), which provides a chemical-etching selectivity relative to the material of the thick dielectric layer 8, in the example TEOS; the overlying layer 10 has a thickness comprised, for example, between 0.2 μm and 1.5 μm.

Figure 1C:
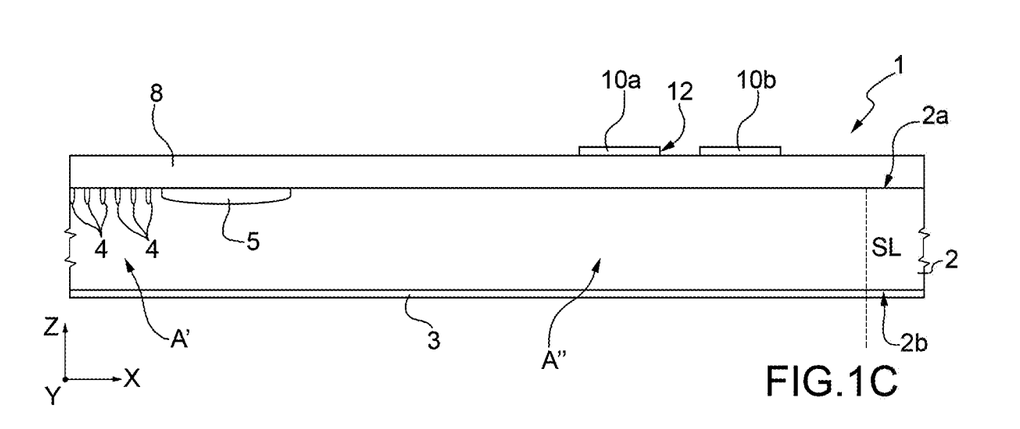

As illustrated in FIG. 1C, the overlying layer 10 is defined via photolithographic process, i.e., via formation of a photoresist mask (not illustrated here) and subsequent etching of the material, in the example polysilicon (selectively with respect to the underlying thick dielectric layer 8).

In particular, definition of the overlying layer 10 leads to formation of a first overlying region 10a and a second overlying region 10b, at the edge area A", which are spaced apart laterally (in the horizontal plane xy, in FIG. 1C along the axis x) and define between them an access window 12. As will be illustrated hereinafter, these overlying regions 10a, 10b can have a ring shape in top view and are arranged around and externally to the active area A' of the power device.

For instance, the first and second overlying regions 10a, 10b may have a same width in the horizontal plane xy (in FIG. 1C along the axis x), for example a width of 20 μm, and the access window 12 may have a width (in FIG. 1C along the axis x; in general, in a direction transverse to a direction of longitudinal extension) comprised between 10 μm and 20 μm.

In particular, the first overlying region 10a is located laterally at a distance (in the horizontal plane xy, in FIG. 1C along the axis x) with respect to the boundary of the active area A' of the power device, therefore being arranged, in use, in an electrically non-active area of the power device (in other words, an area external to the area involved by the electrical field lines due to operation of the power device).

Figure 1D:
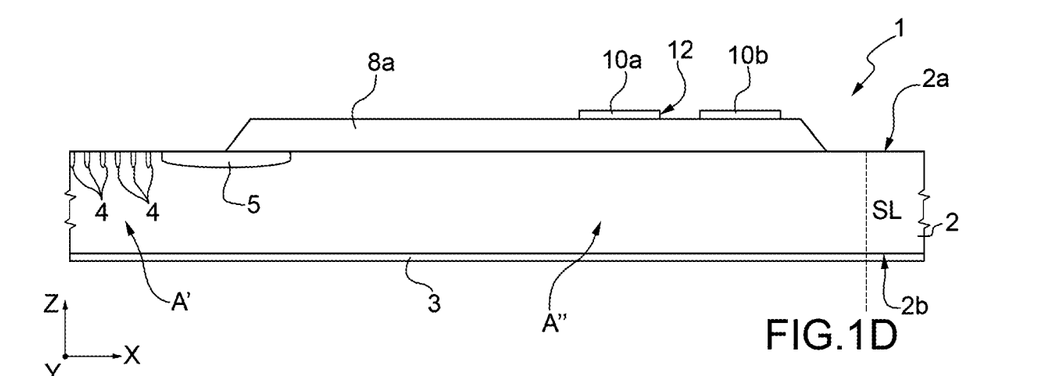

As illustrated in FIG. 1D, the thick dielectric layer 8 is then defined, once again by photolithographic process so as to remove it (therefore leaving the front surface 2a of the substrate 2 exposed) in the active area A' (therefore exposing the anode wells 4 and, at least in part, the edge anode region 5) and moreover along the scribe line SL, leaving a remaining dielectric region 8a above the edge area A".

In a known way, here not shown, anode electrical-contact regions may then be formed, by surface implants in the aforesaid anode wells 4 and edge anode region 5, in order to improve the corresponding electrical contact properties.

Figure 1E:
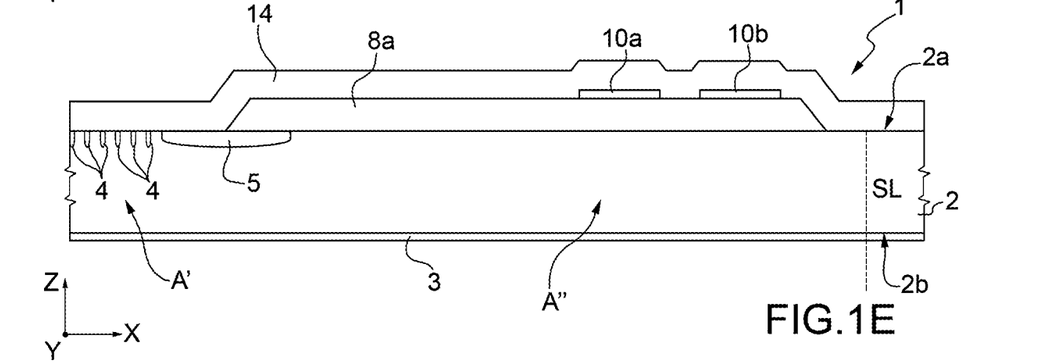

As shown in FIG. 1E, a front conductive layer 14, for example a metal layer, is then formed above the front surface 2a of the substrate 2, in a conformable manner (for example, by a sputtering process).

Figure 1F:
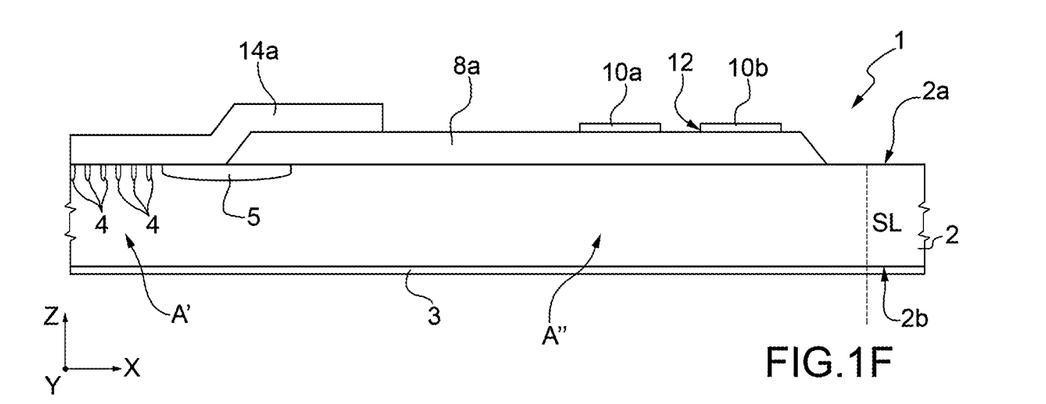

The front conductive layer 14 is then defined, as illustrated in FIG. 1F, via photolithographic process, so as to remove it in the edge area A" and leave a remaining portion thereof, designated by 14a, above the active area A', in particular in direct contact with the front surface 2a of the substrate 2, the anode wells 4, and the edge anode region 5, therefore forming an anode electrical contact of the power device.

As illustrated in the aforesaid FIG. 1F, this remaining portion 14a extends in part also above the dielectric region 8a, at the boundary between the active area A' and the edge area A".

The outer end of the aforesaid remaining portion 14a is in any case sufficiently far from the first overlying region 10a, so that the first overlying region 10a is located, as discussed previously, in a non-active area of the power device (for example, in the case where the electrical field lines terminate at a distance of approximately 20 μm from the outer end of the remaining portion 14a, the first overlying region 10a is arranged at a distance sufficiently higher than 20 μm from the same outer end of the remaining portion 14a).

Figure 1G:
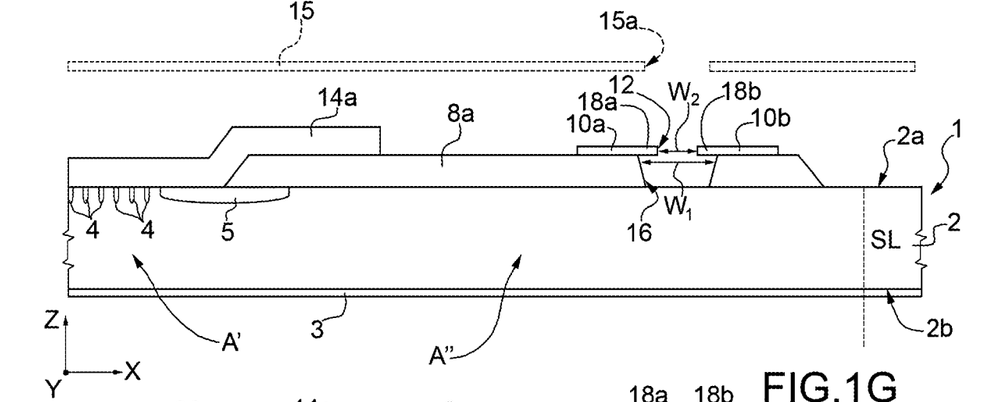

With reference to FIG. 1G, the manufacturing process proceeds with a chemical etching, for example with hydrofluoric acid (HF), of the dielectric region 8a, through the access window 12 defined between the first and second overlying regions 10a, 10b.

In particular, this etching operation is carried out via photolithographic process, with an etching mask 15, represented schematically by a dashed line in the aforesaid FIG. 1G, which coats the entire surface of the wafer 1 and in particular a major part of the same overlying regions 10a, 10b, except for the area at the aforesaid access window 12. In other words, the etching mask 15 has an opening 15a vertically corresponding to the access window 12, having slightly larger dimensions, in the horizontal plane xy (in FIG. 1G along the axis x), than those of the access window 12.

During etching, the chemical-etching agent (in the example, HF) therefore penetrates through the access window 12 through the dielectric region 8a, removing the underlying material (etching stops on the front surface 2a of the substrate 2), without, however, involving the overlying regions 10a, 10b given the characteristics of selectivity of the etching process in regard to the material of the same overlying regions 10a, 10b.

In particular, given that wet etching is totally isotropic, an anchorage opening 16 is formed in the dielectric region 8a, extending vertically (along the vertical axis z) throughout the thickness of the dielectric region 8a, and which horizontally (in the horizontal plane xy, in FIG. 1G along the axis x, in general in a direction transverse to a direction of longitudinal extension) has a width, designated by $W_1$, that is greater than the corresponding width, designated by $W_2$, of the access window 12 (for example, satisfying the relation: $W_1 > W_2 + 10$ μm; in other words, there is, for example, a difference of at least 5 μm with respect to the overlying opening, i.e., the access window 12, on either side along the axis x).

In detail, in the embodiment illustrated, the anchorage opening 16 is trapezium-shaped in cross-section, and the aforesaid dimension $W_1$ has a larger extension, at the major base of the trapezium, facing the access window 12, comprised, for example, between 2 μm and 5 μm (in any case depending upon the thickness of the dielectric, the aforesaid wet etching being isotropic).

Basically, following upon etching, a respective end portion of the first and second overlying regions 10a, 10b, designated by 18a and 18b, respectively, facing the access window 12, is arranged suspended and protruding over the underlying anchorage opening 16.

Figure 1H:
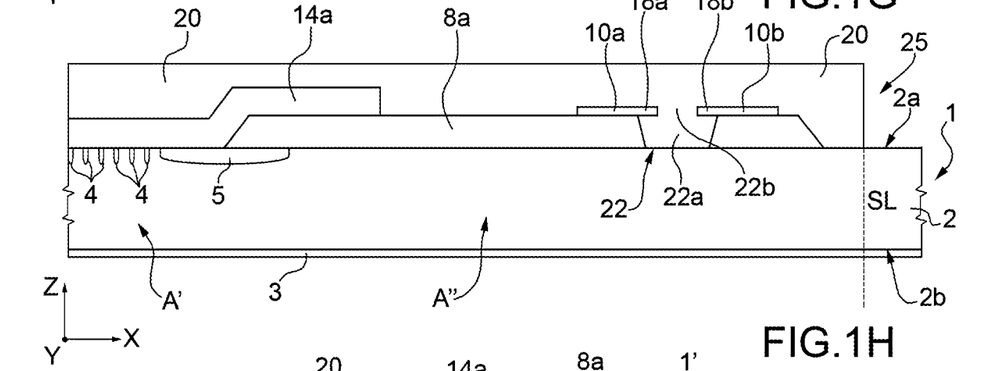

As illustrated in FIG. 1H, a passivation layer 20, in particular, of polyimide (other materials, for example photoresist or the like, which in any case have dielectric characteristics, may be used) is then formed above the entire surface of the wafer 1 (except for the area of the scribe line SL). For instance, the passivation layer is formed using fluid or viscous spin-coating techniques and is subsequently subjected to a curing step.

Following upon its formation, the passivation layer 20 has, in particular, an anchorage region 22, which extends in the anchorage opening 16, occupying it entirely, and has: a first portion 22a, within the aforesaid anchorage opening 16, which assumes a corresponding conformation (in the example, with trapezoidal cross-section); and a second portion 22b, within the access window 12, having a width smaller than that of the first portion (in FIG. 1H, along the axis x).

In particular, the aforesaid first portion 22a of the anchorage region 22 is located directly underneath, and in direct contact with, the end portions 18a, 18b of the first and second overlying regions 10a, 10b, and the aforesaid second portion 22b is arranged between the same end portions 18a, 18b.

The wafer 1 is then subjected to dicing along the scribe line SL, for formation of a die integrating the power device, here designated by 25 (in the example, a power diode).

The aforesaid power device 25 therefore has the passivation layer 20, arranged at least over the dielectric region 8 (of thick dielectric) in the edge area A", that is appropriately anchored thanks to the presence of the corresponding anchorage region 22 and the associated mechanical anchorage within the anchorage opening 16.

Advantageously, this anchorage region 22 allows the passivation layer 20 to remain mechanically anchored, even after thermal cycles (during electrical testing or during effective operation of the power device 25), eliminating or in any case markedly reducing the possibility of delamination of the passivation layer 20 from the underlying material and of consequent electrical-arching phenomena.

Figure 2:
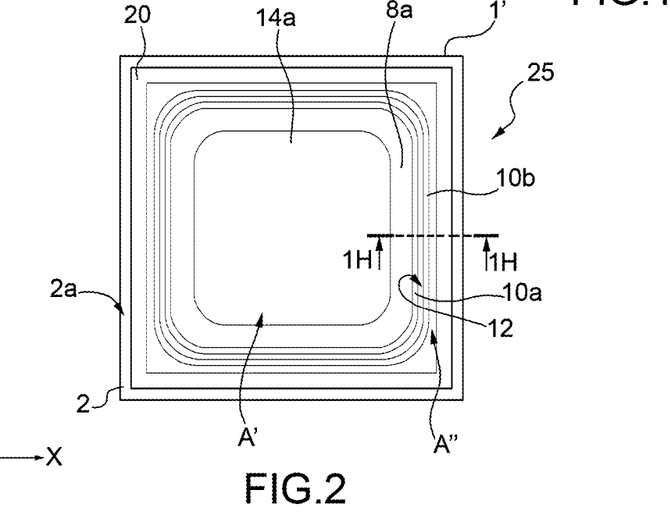
FIGS. 2-4 are schematic top views of the power device of FIG. 1H, according to respective variations.

FIG. 2 is a simplified top view, with parts removed for clarity, of the resulting power device 25 and of the corresponding die, designated by 1' (having a substantially square conformation in top view).

In the embodiment illustrated, the active area A' of the power device 25 has a substantially square conformation in the horizontal plane xy, corresponding to which is a substantially square conformation of the overlying anode electrical contact (constituted by the remaining portion 14a of the front conductive layer 14). The first and second overlying regions 10a, 10b have in this case the conformation of a square ring in the horizontal plane xy and entirely surround the active area A'. The passivation layer 20 extends above the front surface of the die 25' and has, in particular, the anchorage region 22, which also has the shape of a square ring (in top view), being in fact arranged at the access window 12 defined between the aforesaid first and second overlying regions 10a, 10b.

Figure 3:
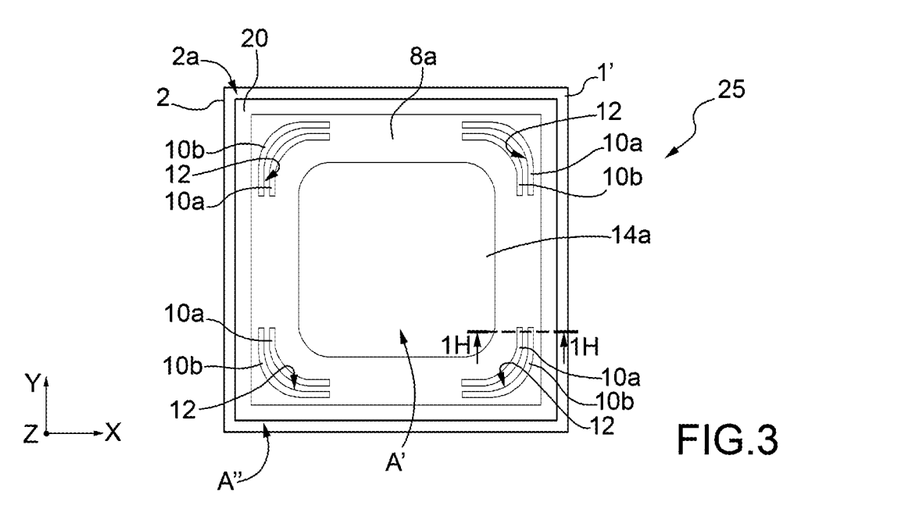

In the variant embodiment illustrated in FIG. 3, the first and second overlying regions 10a, 10b do not form a complete ring around the active area A' of the power device 25, but are arranged in a distributed manner, only at the corners of the active area A', externally thereto. Consequently, also the anchorage region 22 is in this case present in a distributed manner, only at the aforesaid corners, being on the other hand made in a way altogether similar to what has been discussed previously.

FIG. 4 shows, once again in cross-sectional view, a further variant of the power device 25, where the second overlying region 10b has a width in the horizontal plane xy (in FIG. 4 along the axis x, in general in a direction transverse to the direction of longitudinal extension) greater than the corresponding width of the first overlying region 10a.

Figure 4:
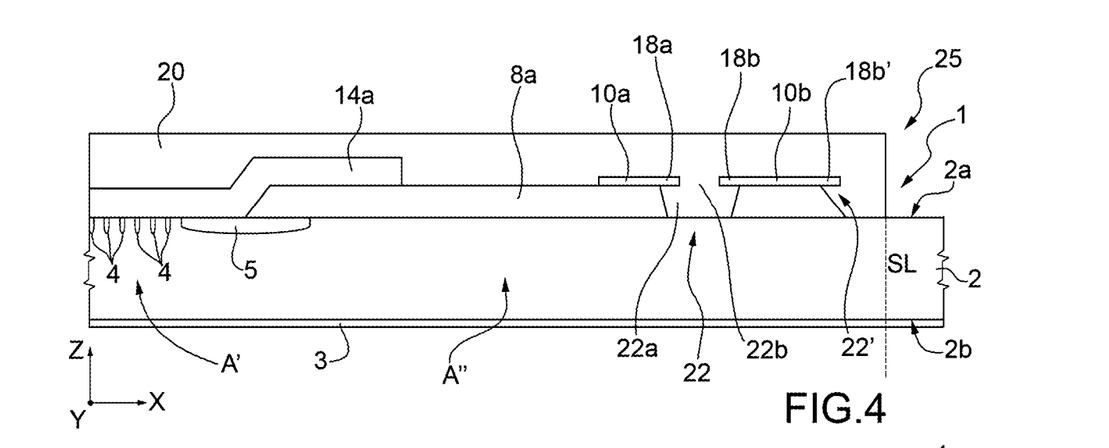

In particular, the aforesaid second overlying region 10b has a further end 18b', opposite to the end 18b facing the access window 12, which protrudes from the underlying dielectric region 8a. Consequently, the passivation layer 20, once formed, has a further anchorage area, designated by 22', arranged directly underneath the aforesaid further end 18b', which therefore contributes to anchoring the passivation layer 20 with respect to the underlying substrate 2 and to preventing delamination phenomena due to the thermomechanical stresses.

In an evident manner, also for this embodiment the configurations discussed previously with reference to FIGS. 2 and 3 may be envisaged.

A further embodiment of the manufacturing process of the power device is now discussed.

Figure 5A:
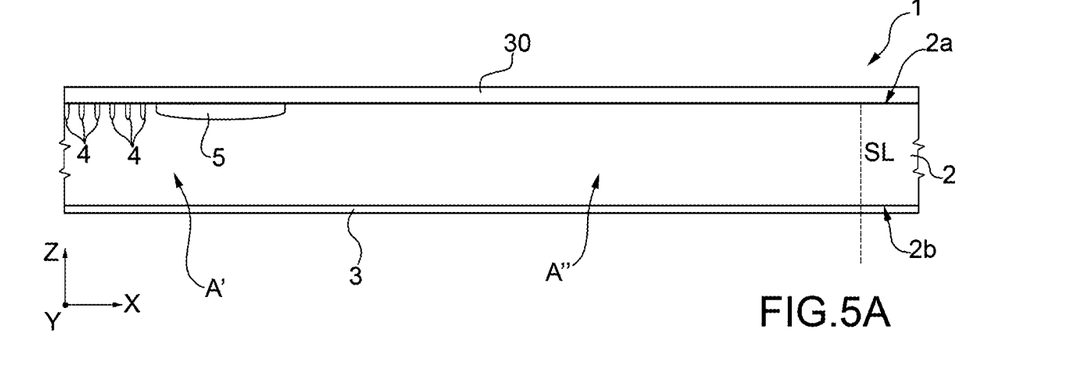
FIGS. 5A-5I are cross-sectional views of a silicon carbide power device, in successive steps of a manufacturing process according to a second embodiment of the present disclosure.

In this case, as shown in FIG. 5A, a first dielectric layer 30, in particular of TEOS, is first deposited above the front surface 2a of the substrate 2 (at which the anode wells 4 and the edge anode region 5 have previously been formed).

Figure 5B:
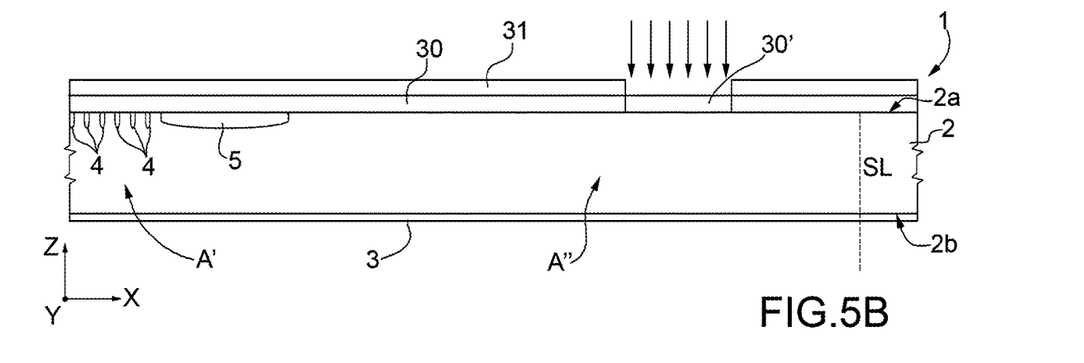

As illustrated in FIG. 5B, this first dielectric layer 30 is then subjected to a dopant implantation (for example, As, Ar, or some other P type dopant) through an appropriate implant mask 31, in a way limited and confined to an external region, at the edge area A" and in the proximity of the scribe line SL, for formation of a doped portion 30' (the width of which in the horizontal plane xy, along the axis x in FIG. 5B, substantially corresponds to the aforesaid width $W_1$, as will be highlighted hereinafter).

The aforesaid doped portion 30' is arranged at what constitutes, during operation, an electrically non-active area of the power device (in other words, it is arranged in an area external to the area involved by the electrical field lines due to operation of the power device).

Figure 5C:
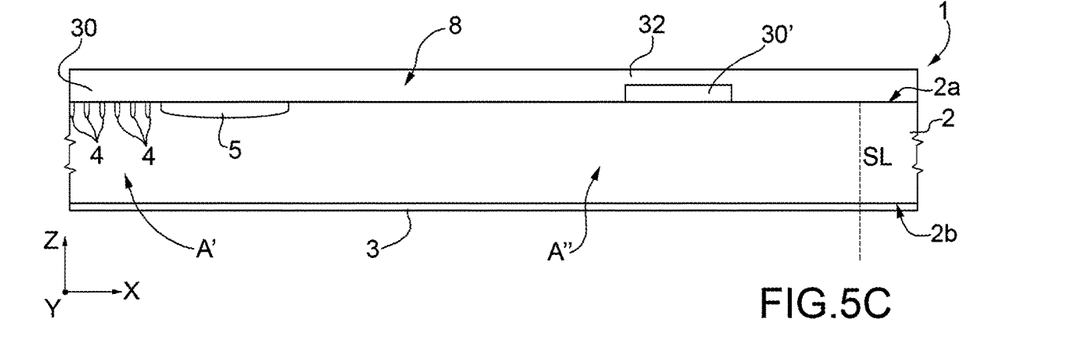

Next, as shown in FIG. 5C, a second dielectric layer 32, in particular once again of TEOS, is deposited above the first dielectric layer 30 (and the corresponding doped portion 30'), the assembly constituted by the first and second dielectric layers 30, 32 forming a thick dielectric layer, once again designated by 8, within which, as has been discussed previously, the aforesaid doped portion 30' is to be incorporated.

In particular, following upon the aforesaid implantation, the doped portion 30' has an etch rate higher than that of the material constituting the second dielectric layer 32; for example, the ratio between the etch rate of the doped portion 30' and that of the second dielectric layer 32 is higher than or equal to two.

Figure 5D:
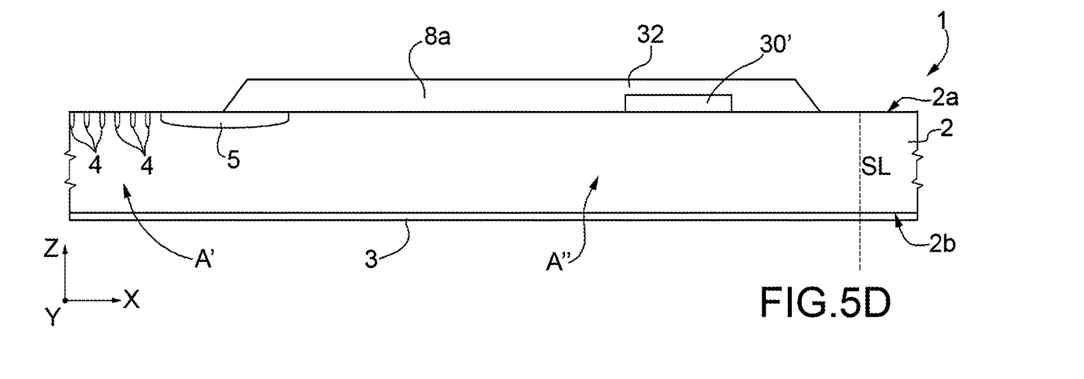

As illustrated in FIG. 5D, the thick dielectric layer 8 is then defined, via photolithographic process, so as to remove it (therefore leaving the front surface 2a of the substrate 2 exposed) in the active area A' (thus exposing the anode wells 4 and, at least in part, the edge anode region 5) and moreover along the scribe line SL, leaving a remaining dielectric region 8a above the edge area A" (wherein the aforesaid doped portion 30' is incorporated).

Figure 5E:
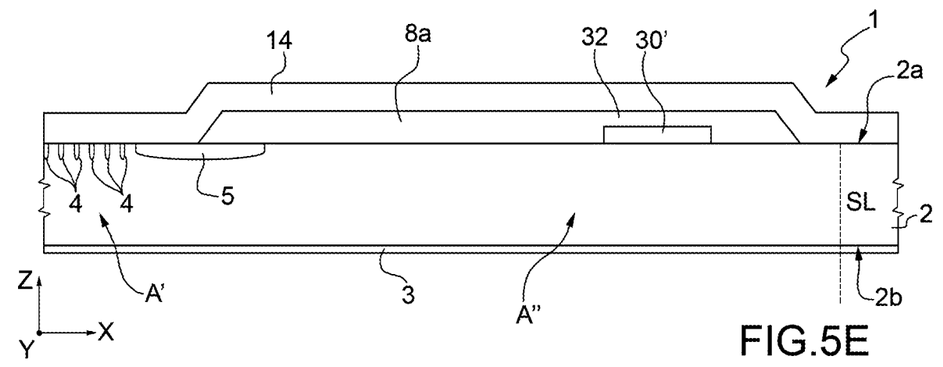

As illustrated in FIG. 5E, the front conductive layer, once again designated by 14, for example a metal layer, is then formed, in a conformable manner on the front surface 2a of the substrate 2 (for example, by a sputtering process).

Figure 5F:
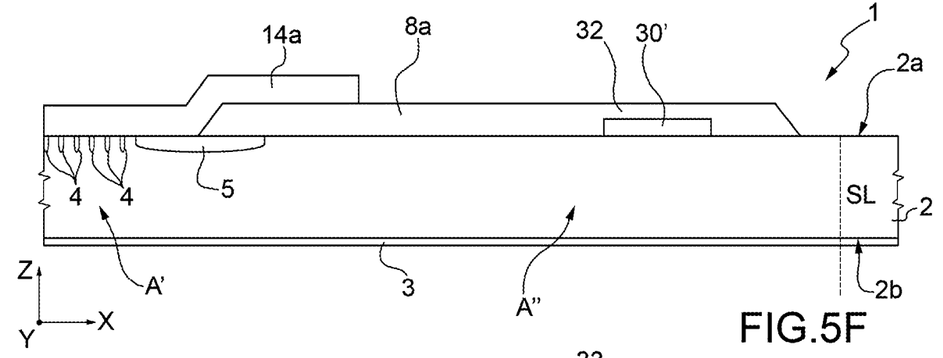

The above front conductive layer 14 is then defined, as illustrated in FIG. 5F, via photolithographic process, so as to remove it in the edge area A" and leave a remaining portion thereof, designated once again by 14a, in the active area A', in particular in direct contact with the front surface 2a of the substrate 2, the anode wells 4, and the edge anode region 5, thus forming the anode electrical contact of the power device.

As illustrated in the aforesaid FIG. 5F, the remaining portion 14a extends in part also on the dielectric region 8a, at the boundary between the active area A' and the edge area A".

Figure 5G:
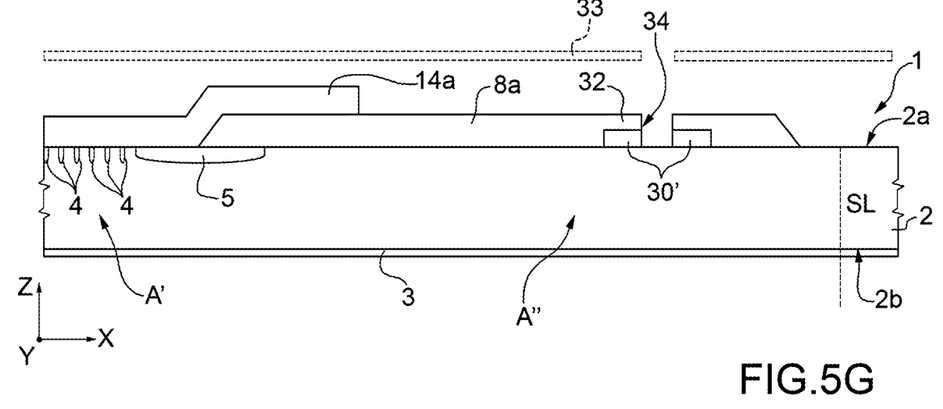

As shown in FIG. 5G, dry etching, for example plasma etching, of the dielectric region 8a is then carried out, in an area vertically corresponding to the corresponding doped portion 30'.

In particular, etching is carried out through an appropriate etching mask 33 (represented schematically with dashed lines) so as to dig a vertical trench 34 throughout the thickness of the dielectric region 8a, centrally with respect to the corresponding doped portion 30' (it is noted that the dry etch involves indistinctly the material of the dielectric region 8a, irrespective of doping, therefore without distinction as regards the corresponding doped portion 30').

Figure 5H:
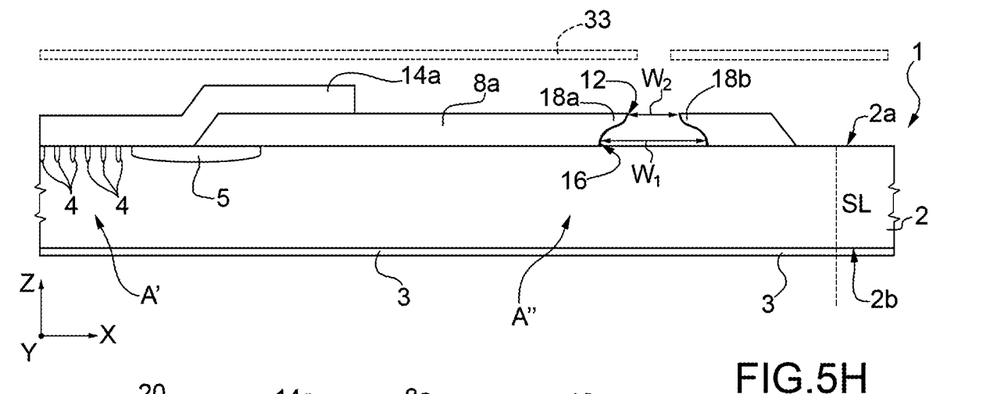

As shown in FIG. 5H, through the same etching mask 33, which has therefore not yet been removed, a second etch is carried out, in particular a wet etch, for example with hydrofluoric acid HF.

On account of the different etch rate, the etch penetrates, in the horizontal plane xy, more into the doped portion 30' than it does into the overlying material of the dielectric region 8a, thus causing removal (in the example, complete removal) of the same doped portion 30', for formation of what is once again defined as the anchorage opening 16 and of the access window 12, overlying, and in fluidic communication with, the same anchorage opening 16, which is in this case also formed in the same dielectric region 8a. The anchorage opening 16 therefore has again, in the horizontal plane xy (in FIG. 5H along the axis x), a width $W_1$ greater than the corresponding width $W_2$ of the access window 12.

It is noted that, in this embodiment, the end portions, once again designated by 18a, 18b, facing the access window 12 and suspended and protruding above the underlying anchorage opening 16 are the result of etching of the surface portion of the dielectric region 8a and are therefore constituted by the material of the same dielectric region 8a.

Figure 5I:
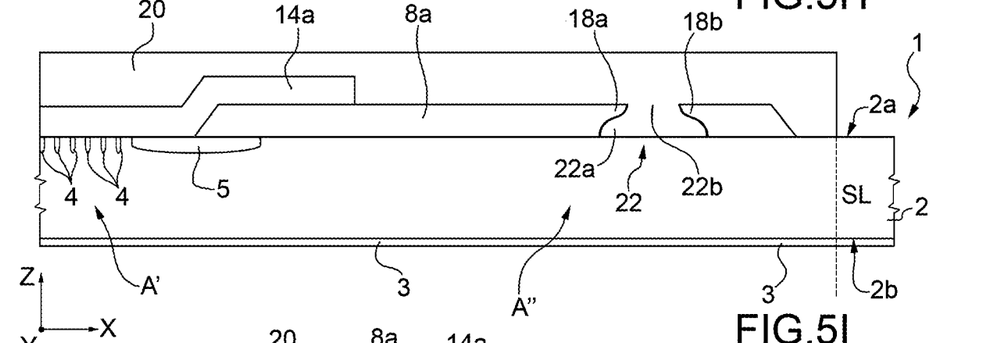

As illustrated in FIG. 5I, the passivation layer 20, for example, of polyimide, is then formed above the entire surface of the wafer 1 (except for the area of the scribe line SL), using spin-coating techniques.

After its formation, the passivation layer 20 has in particular the anchorage region 22, which extends in the anchorage opening 16, occupying it entirely, and once again has: the first portion 22a, within the same anchorage opening 16, having a corresponding conformation; and the second portion 22b, within the access window 12, having a dimension smaller than that of the first portion 22a in the horizontal plane xy (in FIG. 5I, along the axis x).

In particular, the aforesaid first portion 22a of the anchorage region 22 is located directly underneath, and in direct contact with, the end portions 18a, 18b of the dielectric region 8a, and the aforesaid second portion 22b is arranged between the same end portions 18a, 18b of the dielectric region 8a.

The wafer 1 is then subjected to dicing along the scribe line SL, for formation of the die containing the power device, once again designated by 25.

Also in this case, advantageously, the anchorage region 22 enables the passivation layer 20 to remain anchored and fixed, even following upon thermal cycles and the resulting electromechanical stresses.

Figure 6:
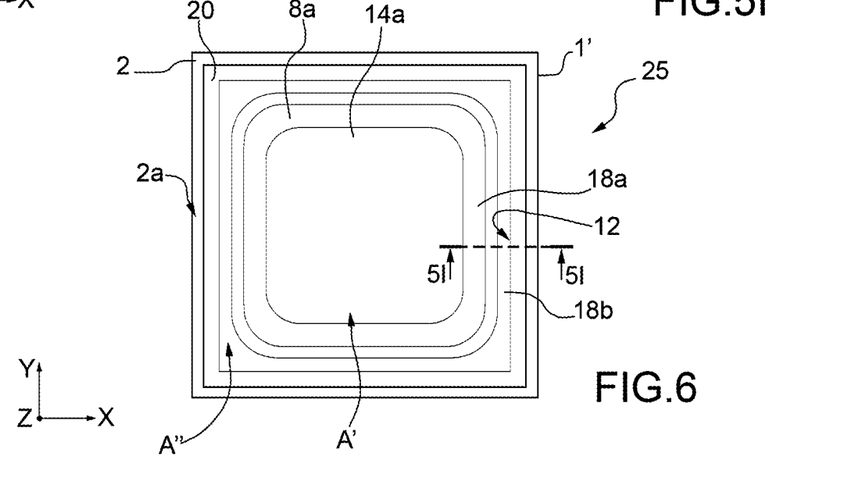
FIGS. 6-7 are schematic top views of the power device of FIG. 5I, according to respective variations.

FIG. 6 is a top view, simplified and with parts removed for clarity, of the resulting power device 25 and of the corresponding die 1' (having a substantially square conformation in top view).

In the embodiment illustrated, the active area A' of the power device 25 has a substantially square conformation in the horizontal plane xy, corresponding to which is a substantially square conformation of the remaining overlying portion 14a of the front conductive layer 14 (which constitutes the anode electrical contact).

The anchorage opening 16 and the corresponding anchorage region 22 of the passivation layer 20 have the conformation of a square ring in the horizontal plane xy itself, entirely surrounding the active area A'.

Figures 7, 8A:
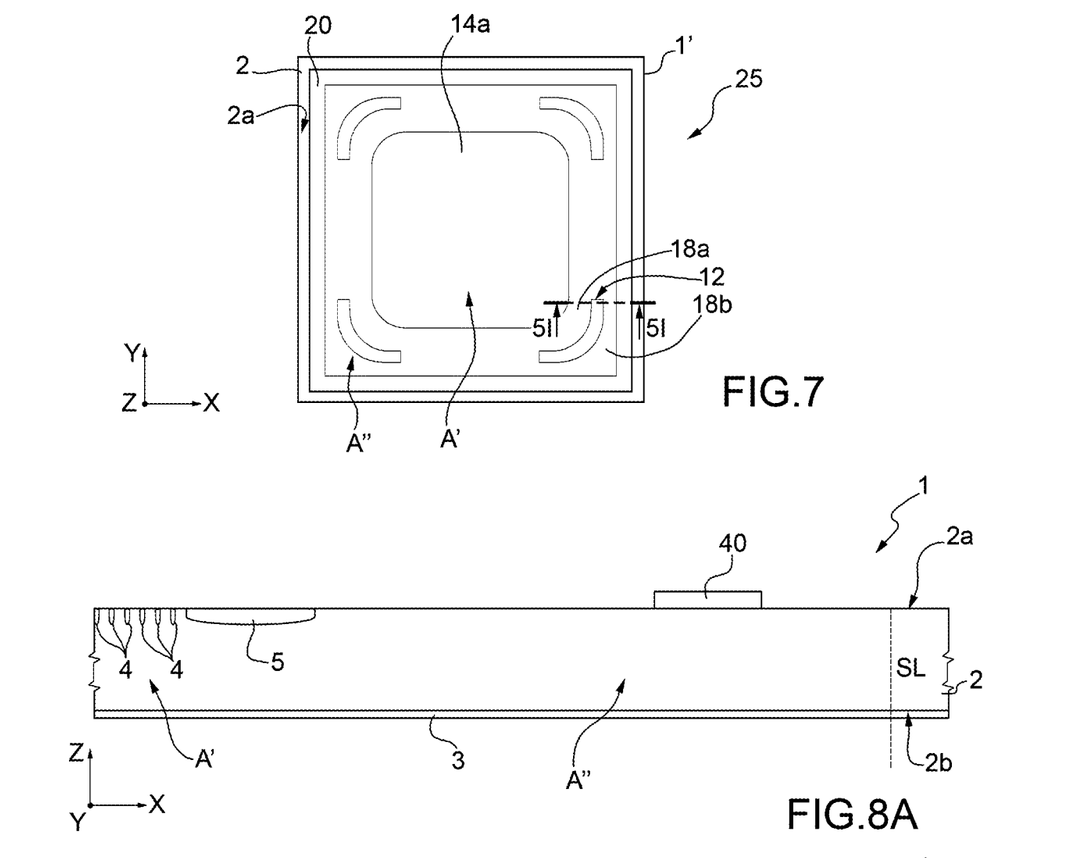
FIGS. 8A-8H are cross-sectional views of a silicon carbide power device, in successive steps of a manufacturing process according to a third embodiment of the present disclosure.

In the embodiment illustrated in FIG. 7, the aforesaid anchorage opening 16 and the aforesaid anchorage region 22 do not form a complete ring around the active area A' of the power device 25, but are arranged in a distributed manner only at the corners of the active area A', externally thereto.

A further embodiment of the process for manufacturing the power device is now discussed.

In this case, as illustrated in FIG. 8A, a sacrificial region 40 is first formed above the front surface 2a of the substrate 2, by deposition via photolithographic process; the sacrificial region 40 is made of polysilicon or other appropriate material (for example, silicon nitride), which provides a chemical-etching selectivity relative to the dielectric material, for example TEOS, of which the thick dielectric layer 8 will then be formed.

The sacrificial region 40 is formed in a manner limited and confined to an external region of the power device, in the edge area A" and in the proximity of the scribe line SL, therefore being arranged in what constitutes, during operation, an electrically non-active area of the power device (in other words, being arranged in an area external to the area involved by the electrical field lines due to operation of the power device).

The sacrificial region 40 has, for example, a width of approximately 30 µm (in particular, the width of the sacrificial region 40 in the horizontal plane xy, along the axis x in FIG. 6A, corresponds substantially to the aforesaid width $W_1$, as will on the other hand be highlighted hereinafter).

Figure 8B:
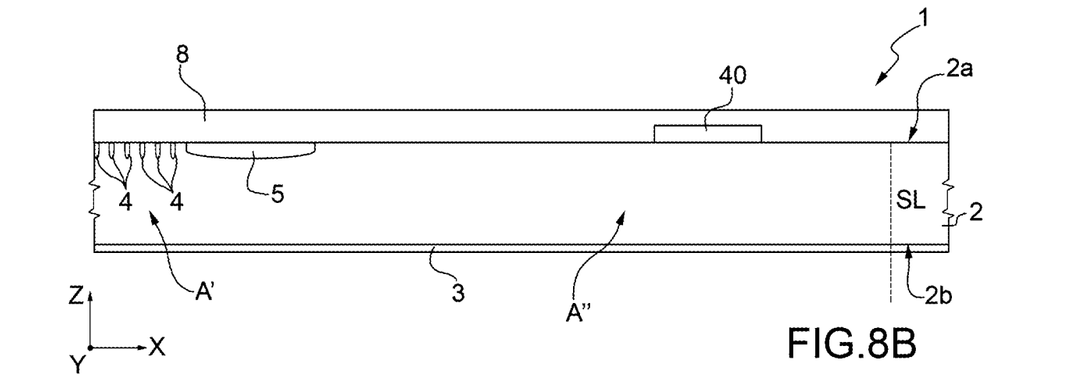

Then (FIG. 8B), the thick dielectric layer 8, for example, once again of TEOS, is deposited above the front surface 2a of the substrate 2 and in particular on the sacrificial region 40, which is therefore incorporated within the same thick dielectric layer 8.

Figure 8C:
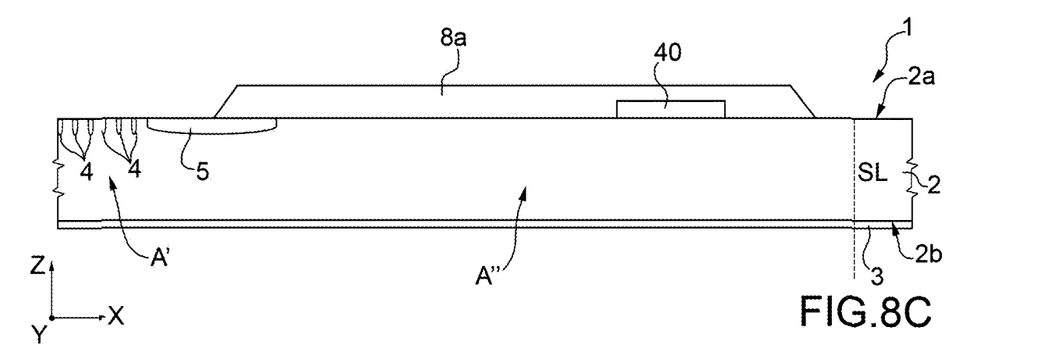

As shown in FIG. 8C, the thick dielectric layer 8 is then defined, via photolithographic process, in a way substantially similar to what has been discussed previously, therefore so as to remove it in the active area A' and moreover along the scribe line SL, leaving a remaining dielectric region 8a above the edge area A" (wherein the aforesaid sacrificial region 40 is incorporated).

Figure 8D:
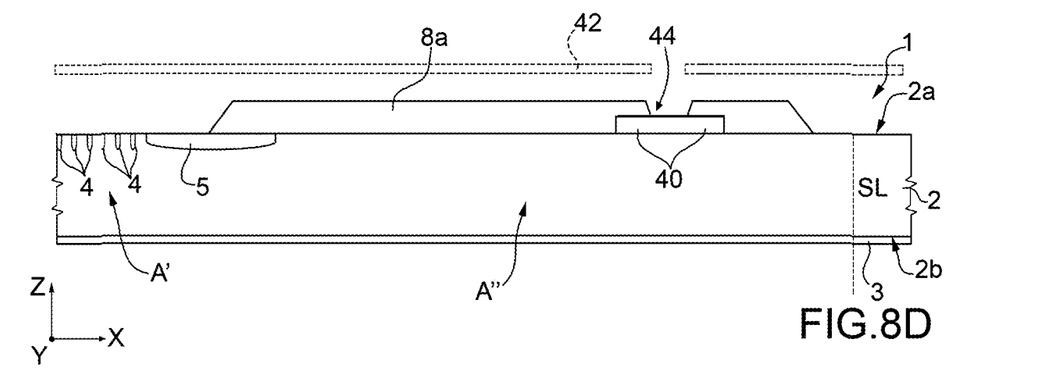

As illustrated in FIG. 8D, the manufacturing process proceeds in this case with dry etching, for example plasma etching, of the dielectric region 8a, in an area vertically corresponding to the sacrificial region 40.

In particular, etching is carried out using an appropriate etching mask 42 (represented schematically with a dashed line), so as to dig a trench 44 throughout the thickness of the dielectric region 8a, centrally with respect to the aforesaid sacrificial region 40.

Figure 8E:
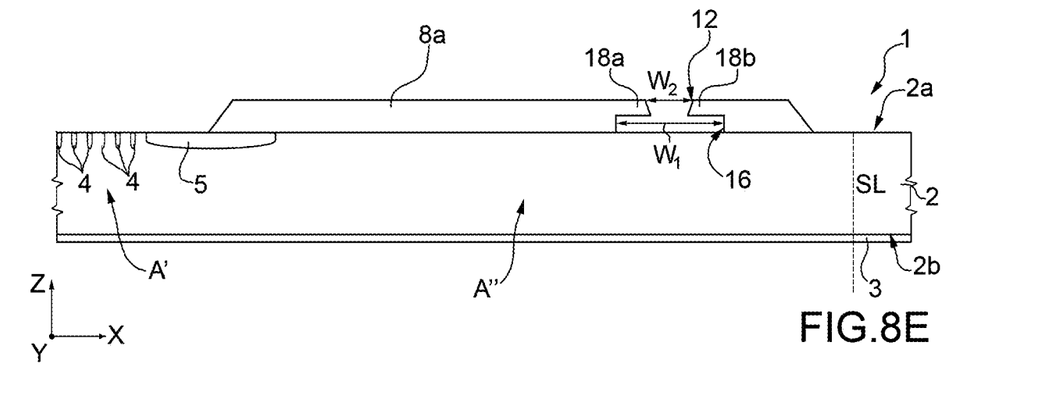

As illustrated in FIG. 8E, after removal of the etching mask 42, a second etch is carried out, in particular a wet etch for selective removal of the remaining sacrificial region 40. In particular, the etching agent penetrates into the trench 44 and moves laterally to remove the aforesaid sacrificial region 40 so as to form what is once again defined as anchorage opening 16 in the dielectric region 8a and the access window 12, overlying, and in fluidic communication with, the same anchorage opening 16, which in this case is also formed in the same dielectric region 8a (the anchorage opening 16 once again has in the horizontal plane xy, in FIG. 8E along the axis x, a width $W_1$ greater than the corresponding width $W_2$ of the access window 12).

The anchorage opening 16 has in this case a substantially rectangular shape in cross-section, and the access window has a substantially trapezoidal section (with the minor base facing the aforesaid anchorage opening 16).

It is noted that, also in this embodiment, the end portions 18a, 18b, facing the access window 12 and suspended and protruding above the underlying anchorage opening 16, are the result of etching of the surface portion of the dielectric region 8a and are integral with the same dielectric region 8a.

Figure 8F:
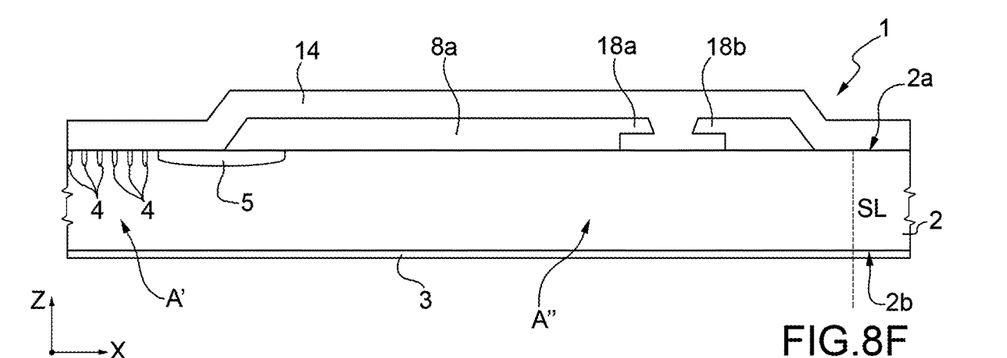

As illustrated in FIG. 8F, the front conductive layer, once again designated by 14, for example of metal material, is then formed, in a conformable manner on the front surface 2a of the substrate 2 (for example, by a sputtering process); it is noted that in this case, the front conductive layer 14 also penetrates into the anchorage opening 16 and the access window 12, in the example filling them.

Figure 8G:
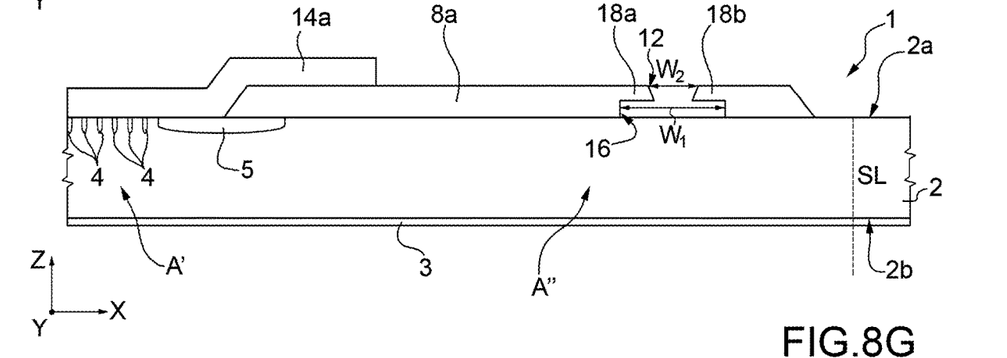

The front conductive layer 14 is then defined, as illustrated in FIG. 8G, via photolithographic process, so as to remove it in the edge area A" and leave a remaining portion thereof, designated once again by 14a, above the active area A', in particular in direct contact with the front surface 2a of the substrate 2, the anode wells 4, and the edge anode region 5, therefore forming the anode electrical contact of the power device. As illustrated in the aforesaid FIG. 8G, this remaining portion 14a extends in part also on the dielectric region 8a, at the boundary between the active area A' and the edge area A". It is noted that this etching envisages complete removal of the material within the anchorage opening 16 and the access window 12.

Figure 8H:
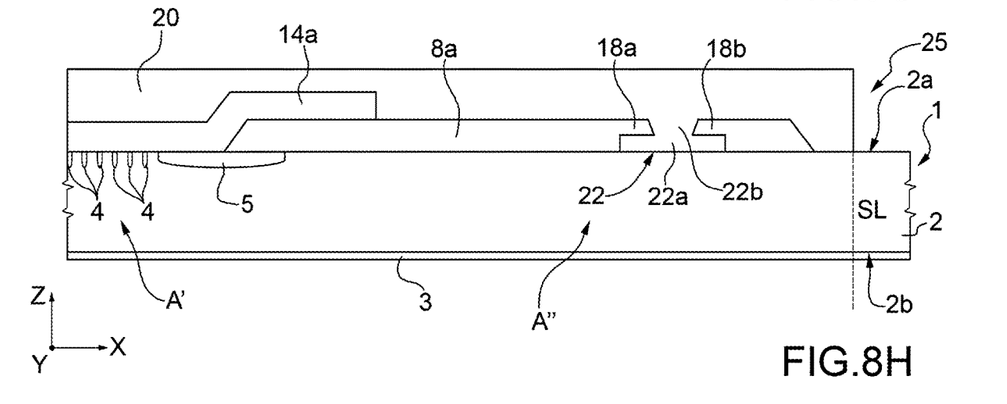

As illustrated in FIG. 8H, the passivation layer 20, for example of polyimide is then formed above the entire surface of the wafer 1 (except for the area of the scribe line SL), using spin-coating techniques.

Following upon its formation, the passivation layer 20 has in particular the anchorage region 22, which extends in the anchorage opening 16, occupying it entirely, and once again has: the first portion 22a, within the same anchorage opening 16, having a corresponding conformation (also in this case being rectangular in section); and the second portion 22b, within the access window 12, having a size smaller than that of the first portion 22a in the horizontal plane xy (in FIG. 8H, along the axis x).

In particular, the aforesaid first portion 22a of the anchorage region 22 is located also in this case directly underneath, and in direct contact with, the end portions 18a, 18b of the dielectric region 8a, and the aforesaid second portion 22b is arranged between the same end portions 18a, 18b of the dielectric region 8a.

The wafer 1 is then subjected to dicing along the scribe line SL, for formation of the die integrating the power device, once again designated by 25.

Also in this case, advantageously, the anchorage region 22 enables the passivation layer 20 to remain anchored in a fixed manner within the anchorage opening 16, even following upon thermal cycles and resulting electromechanical stresses.

Figure 9:
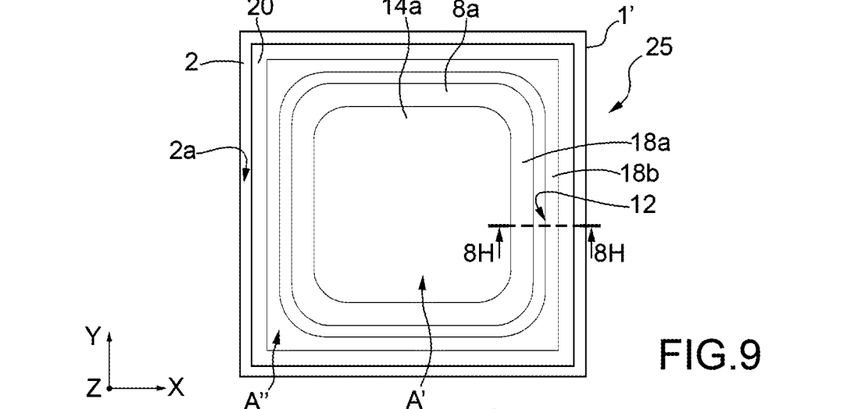
FIGS. 9-10 are schematic top views of the power device of FIG. 8H, according to respective variations.

FIG. 9 is a simplified top view, with parts removed for clarity, of the resulting power device 25 and of the corresponding die 1' (having a substantially square conformation in top view). In the embodiment illustrated, the active area A' of the power device 25 has a substantially square conformation in the horizontal plane xy, corresponding to which is a substantially square conformation of the remaining overlying portion 14a of the front conductive layer 14 (which defines the anode electrical contact).

The anchorage opening 16 and the corresponding anchorage region 22 of the passivation layer 20 have the conformation of a square ring in the horizontal plane xy, surrounding the active area A' entirely.

Figure 10:
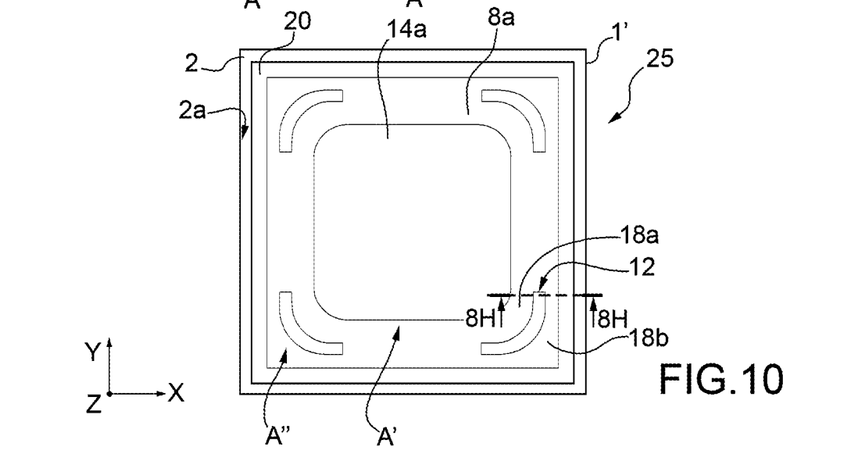

In the embodiment illustrated in FIG. 10, the aforesaid anchorage opening 16 and the aforesaid anchorage region 22 do not form a complete ring around the active area A' of the power device 25, but are arranged in a distributed way only at the corners of the active area A', externally thereto.

The advantages of the present solution are clear from the foregoing description.

In particular, it is once again underlined that, thanks to the presence of the anchorage region 22, the passivation layer 20 is anchored and fixed in a reliable manner, thus preventing possible delamination thereof, i.e., its partial detachment from the underlying material, on account of thermomechanical stresses due to thermal cycles.

Consequently, the present solution enables maximization of the reliability and robustness of a resulting power device 25, in particular with respect to the corresponding edge termination (from which, in use, the aforesaid delamination phenomena start), which is obtained starting from the silicon carbide substrate 2.

The manufacturing process, in the embodiments described, is convenient and economically advantageous to implement, including processing steps that are in themselves standard in the semiconductor industry.

Finally, it is clear that modifications and variations may be made to what has been described and illustrated herein, without thereby departing from the scope of the present disclosure.

In particular, it is underlined that the present solution can find advantageous application in any electronic device, in particular for power applications, in which anchorage of a passivation layer to an underlying material is advantageous to prevent phenomena of delamination due, for example, to thermomechanical stresses.

Moreover, it is underlined that the present solution may envisage a desired number of anchorage regions 22, obtained in a way altogether corresponding to what has been discussed previously, in particular in the edge area A" of the power device 25.

Provision of a plurality of anchorage regions 22 may in fact enable a further increase in the anchoring of the passivation layer 20 and therefore a further increase in the reliability of the resulting power device 25.

These anchorage regions 22 may have any desired arrangement; for example, they may be arranged according to a grid arrangement in the aforesaid edge area A".

Figure 11:
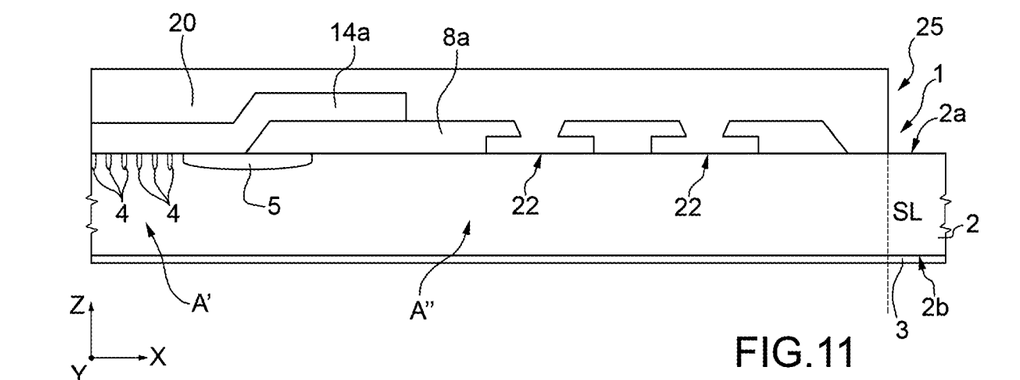
FIG. 11 is a cross-sectional view of a silicon carbide power device, in a final step of the manufacturing process, according to a further variation of the present solution.

Purely by way of example, FIG. 11 shows the cross-section of a power device 25 (in particular, a power diode, but it is evident that what has been illustrated may be applied for any different electronic device), which has two anchorage regions 22 in the edge area A", spaced apart at an appropriate separation distance (in FIG. 11 along the axis x).

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic power device, comprising:
a substrate of silicon carbide (SiC) having a front surface and a rear surface which lie in a horizontal plane and are opposite to one another along a vertical axis transverse to said horizontal plane, the substrate including an active area, and a non-active edge area surrounding said active area, a plurality of doped regions extending from the front surface into the substrate in the active area;
a dielectric region over said front surface in at least said edge area;
a passivation layer over the front surface of said substrate, the passivation layer in contact with said dielectric region in said edge area,
wherein said passivation layer includes at least one anchorage region that extends through a thickness of said dielectric region at said edge area and is configured to define a mechanical anchorage for said passivation layer, and
wherein said anchorage region includes:
a first portion within said dielectric region and having a first width along an axis of said horizontal plane; and
a second portion overlying said first portion along the vertical axis, the second portion having a second width, smaller than said first width along said axis of the horizontal plane; and
a first and a second abutment element on and in direct contact with the first portion, the first and second abutment elements arranged laterally and on opposite sides of said second portion.

2. The device according to claim 1, wherein said first portion is arranged in a bottom layer of said dielectric region, and said first and second abutment elements are portions of a top layer of said dielectric region, interposed vertically between said first portion of the anchorage region and said passivation layer.

3. The device according to claim 1, wherein said first portion traverses the entire thickness of said dielectric region, and said first and second abutment elements are defined by respective end portions of a first overlying region and of a second overlying region, overlying said dielectric region and vertically interposed between said first portion of the anchorage region and said passivation layer.

4. The device according to claim 3, wherein said first and second abutment elements include a material having a chemical-etching selectivity relative to a material of said dielectric region.

5. The device according to claim 4, wherein said dielectric region is made of TetraEthyl OrthoSilicate (TEOS) and said material having a chemical-etching selectivity relative to the material of said dielectric region is polysilicon.

6. The device according to claim 4, wherein said second overlying region has an end, opposite to said second abutment element, that extends horizontally beyond said dielectric region towards an outer edge of said electronic power device, and wherein said passivation layer is arranged laterally with respect to said dielectric region at said outer edge of the electronic power device, an anchorage portion of said passivation layer being interposed in contact between said end of said second overlying region and an external portion of said dielectric region.

7. The device according to claim 1, wherein said passivation layer includes polyimide.

8. The device according to claim 1, wherein said anchorage region is fixed to said passivation layer and coupled in contact with the front surface of the substrate at said edge area, in a region where electrical field lines due to operation of said electronic power device are absent.

9. The device according to claim 1, wherein said passivation layer includes further anchorage regions that extend through the thickness of said dielectric region at said edge area and are jointly configured to define said mechanical anchorage for said passivation layer.

10. The device according to claim 1, wherein said anchorage region extends in a continuous manner around said active area, in said horizontal plane.

11. The device according to claim 1, wherein said active area has, in the horizontal plane, a square or rectangular shape, and said anchorage region extends in said horizontal plane adjacent to corners of said active area.

12. A process for manufacturing an electronic power device, comprising:
forming a dielectric region on a front surface of a substrate of silicon carbide (SiC), at an edge area of the substrate, the substrate having the front surface and a rear surface which lie in a horizontal plane and are opposite to one another along a vertical axis transverse to said horizontal plane, said substrate including an active area and the edge area, which is not active, a plurality of doped regions extending from the front surface into the substrate in the active area;

forming a passivation layer over the front surface of said substrate, and in contact with said dielectric region in said edge area, the forming the passivation layer including forming an anchorage region that extends through a thickness of said dielectric region at said edge area and is configured to define a mechanical anchorage for said passivation layer;

forming an anchorage opening through said dielectric region, the anchorage opening having a first width along an axis of said horizontal plane; and forming an access window on and overlying said anchorage opening along the vertical axis, the access window having a second width, smaller than said first width along said axis of the horizontal plane, the access window being defined between a first and a second abutment element, which are arranged laterally and on opposite side of said access window, wherein the forming the anchorage region includes filling said anchorage opening and access window, said anchorage region including a first portion, formed within said anchorage opening, and a second portion, formed within said access window, said first and second abutment elements on and in direct contact with the first portion and arranged laterally and on opposite side of said second portion, said anchorage region mechanically fixes said passivation layer with respect to said anchorage opening.

13. The process according to claim 12, wherein the forming the anchorage opening includes:

forming a first and a second overlying region above said dielectric region by etching a layer of material having a chemical-etching selectivity relative to a material of said dielectric region, the first and second overlying regions defining between them said access window; and performing a chemical etch of said dielectric region through said access window, and etching respective end portions of the first and second overlying regions suspended and protruding above the underlying anchorage opening, the end portions of the first and second overlying regions respectively defining said first and second abutment elements.

14. The process according to claim 13, wherein said dielectric region is made of TetraEthyl OrthoSilicate (TEOS) and said material having a chemical-etching selectivity relative to the material of said dielectric region is polysilicon.

15. The process according to claim 12, wherein the forming the anchorage opening includes:

forming a doped portion, by dopant implantation at an outer bottom portion of said dielectric region at said edge area, the doped portion incorporated within said dielectric region in contact with said front surface of said substrate, said doped portion having an etch rate higher than that of the material of an overlying portion of said dielectric region;

forming a trench through the dielectric region by performing a dry etch of the dielectric region at the doped portion, through an etching mask, the trench positioned centrally with respect to the doped portion; and removing the doped portion by performing a wet etch, through said etching mask, portions of said dielectric region, suspended and protruding above the underlying anchorage opening, defining said first and said second abutment elements.

16. The process according to claim 12, wherein the forming the anchorage opening includes:

forming a sacrificial region over said front surface at said edge area, wherein said forming the dielectric region includes forming said dielectric region on said sacrificial region, said sacrificial region being incorporated within said dielectric region;

forming a trench through the dielectric region by performing a dry etch of the dielectric region, at the sacrificial region, through an etching mask, the trench positioned centrally with respect to the sacrificial region; and removing the sacrificial region by performing a wet etch; portions of said dielectric region, suspended and protruding above the underlying anchorage opening, defining said first and said second abutment elements.

17. The process according to claim 12, wherein said passivation layer includes polyimide.

18. The process according to claim 12, wherein said anchorage region is fixed to said passivation layer and coupled in contact with said front surface of said substrate at said edge area, in a region where electrical field lines due to operation of said electronic power device are absent.

* * * * *